United States Patent [19]

Gill et al.

[11] Patent Number: 5,008,721
[45] Date of Patent: Apr. 16, 1991

[54] ELECTRICALLY-ERASABLE, ELECTRICALLY-PROGRAMMABLE READ-ONLY MEMORY CELL WITH SELF-ALIGNED TUNNEL

[75] Inventors: Manzur Gill, Rosharon; Sung-Wei Lin, Houston; C. Rinn Cleavelin, Lubbock; David J. McElroy, Rosenberg, all of Tex.

[73] Assignee: Texas Instruments Incorporated, Dallas, Tex.

[21] Appl. No.: 494,042

[22] Filed: Mar. 15, 1990

Related U.S. Application Data

[63] Continuation of Ser. No. 219,529, Jul. 15, 1988, abandoned.

[51] Int. Cl.$^5$ .................. H01L 29/68; H01L 29/34; G11C 11/34
[52] U.S. Cl. .................. 357/23.5; 357/54; 365/185
[58] Field of Search .................. 357/23.5, 54; 365/185

[56] References Cited

U.S. PATENT DOCUMENTS

| | | | |
|---|---|---|---|
| 4,180,826 | 12/1979 | Shappir | 357/41 |
| 4,203,158 | 5/1980 | Frohman-Bentchkowsky | 365/185 |
| 4,377,818 | 3/1983 | Kuo et al. | 357/45 |
| 4,377,857 | 3/1983 | Tickle | 365/185 |
| 4,493,057 | 1/1985 | McElroy | 365/182 |
| 4,590,504 | 5/1986 | Suterman | 357/23.11 |
| 4,622,737 | 11/1986 | Ravaglia | 357/23.5 |
| 4,668,970 | 5/1987 | Yatsuda et al. | 357/23.5 |
| 4,686,558 | 8/1987 | Adam | 357/42 |
| 4,750,024 | 6/1988 | Schreck | 357/23.5 |

Primary Examiner—Rolf Hille
Assistant Examiner—Robert P. Limanek
Attorney, Agent, or Firm—W. James Brady, III; James T. Comfort; Melvin Sharp

[57] ABSTRACT

An electrically-erasable, electrically-programmable ROM or an EEPROM is constructed using an enhancement transistor merged with a floating-gate transistor, where the floating-gate transistor has a small self-aligned tunnel window positioned on the opposite side of the source from the channel and drain, in a contact-free cell layout, enhancing the ease of manufacture and reducing cell size. In this cell, the bitlines and source/-drain regions are buried beneath relatively thick silicon oxide, which allows a favorable ratio of control gate to floating gate capacitance. Programming and erasing are provided by the tunnel window area on the outside of the source (spaced from the channel). The tunnel window has a thinner dielectric than the remainder of the floating gate to allow Fowler-Nordheim tunneling.

22 Claims, 3 Drawing Sheets

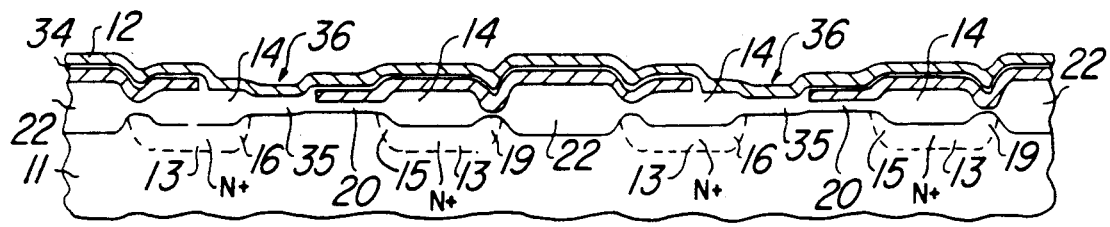
Fig. 2a
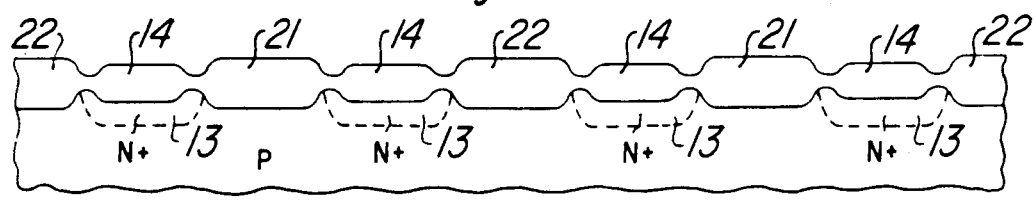
Fig. 2b
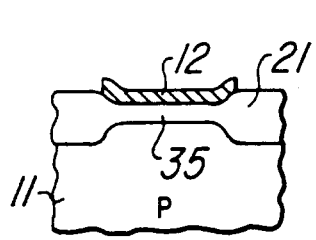 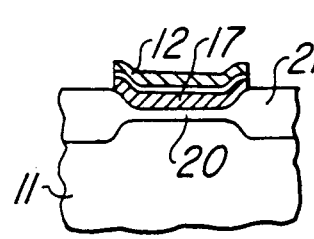 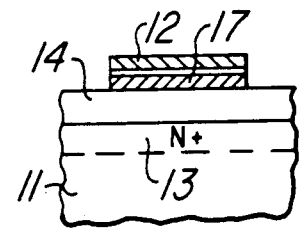
Fig. 2c    Fig. 2d    Fig. 2e
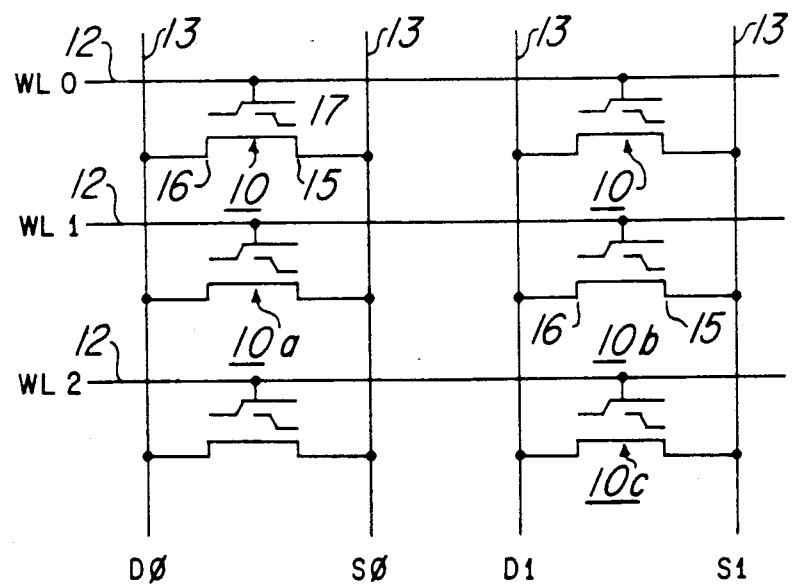
Fig. 3

ELECTRICALLY-ERASABLE, ELECTRICALLY-PROGRAMMABLE READ-ONLY MEMORY CELL WITH SELF-ALIGNED TUNNEL

This application is a continuation of pending U.S. patent application Ser. No. 07/219,529, filed July 15, 1988, now abandoned.

RELATED APPLICATIONS

This application discloses subject matter also disclosed in co-pending U.S. patent applications Ser. Nos. 07/494,060, which is a continuation of pending U.S. patent application Ser. Nos. 07/219,530 filed July 15, 1988, and 07/494,051, which is a continuation of pending U.S. patent application Ser. No. 07/219,528 filed July 15, 1988, filed herewith and also assigned to Texas Instruments Incorporated. The foregoing applications are hereby incorporated herein by reference.

BACKGROUND OF THE INVENTION

This invention relates to semiconductor memory devices, and more particularly to an electrically-erasable, electrically-programmable ROM (read-only-memory) of the floating-gate type, and to a method for making such a device.

EPROMs, or electrically-programmable ROMs, are field-effect devices with a floating-gate structure. An EPROM floating gate is programmed by applying proper voltages to the source, drain and control gate of each cell, causing high current through the source-drain path and charging of the floating gate by hot electrons. The EPROM type of device is erased by ultraviolet light, which requires a device package having a quartz window above the semiconductor chip. Packages of this type are expensive in comparison with the plastic packages ordinarily used for other memory devices such as DRAMs (dynamic-random-accessmemories). For this reason, EPROMs are generally more expensive than plastic-packaged devices. EPROM devices of this type, and methods of manufacture, are disclosed in U.S. Pat. Nos. 3,984,822; 4,142,926; 4,258,466; 4,376,947; 4,326,331; 4,313,362; or 4,373,248; for example. Of particular interest to this invention is U.S. Pat. No. 4,750,024, issued June 7, 1988 and filed Feb. 18, 1986 by John F. Schreck and assigned to Texas Instruments Incorporated, where an EPROM is shown made by a method similar to that of U.S. Pat. No. 4,258,466; but with an offset floating gate.

EEPROMs, or electrically-erasable, electrically-programmable ROMs, have been manufactured by various processes, usually requiring a much larger cell size than standard EPROMs, and requiring more complex manufacturing processes. EEPROMs can be mounted in opaque plastic packages that reduce the packaging cost. Nevertheless, EEPROMs have been more expensive on a per-bit basis, in comparison with EPROMs, due to larger cell size and to more complex manufacturing processes.

Flash EEPROMs have the advantage of smaller cell size in comparison with standard EEPROMs because the cells are not erased individually. Instead, the array of cells is erased in bulk.

Currently available flash EEPROMs require two power supplies, one for programming and erasing and another for reading. Typically, a 12-volt power supply is used for programming and erasing and a 5-volt power supply is used during read operations. It is desirable, however, to employ a single relatively low-voltage supply for all of the programming, erasing and reading operations.

The EEPROMs disclosed in co-pending U.S. patent applications Nos. 07/494,060 and 07/494,051, filed herewith, provide a greatly improved structure and method for making cells having reduced size and ease of manufacture, resulting in a device requiring one relatively low-voltage (perhaps +5 v) power supply to the chip. Nevertheless, in some situations improvement in the break-down voltage at the source-to-substrate interface beneath the edge of the source region, as explained below, is believed to be possible in such devices.

It is the principal object of the invention to provide an EEPROM in which the tunnel is self-aligned so that manufacture is facilitated and reliability is enhanced. Further, it is an object to provide an EEPROM having reduced cell size and having improved coupling between control gate and floating gate. Other objects include provision of a cell resistant to bitline stress, which is the deprogramming of a programmed cell during write operations, and include improved field-plate breakdown voltage. Another object of this invention is to provide a electrically programmable memory, or an electrically-erasable and electrically-programmable memory, which can be packaged in a less expensive opaque plastic package. Another object is to provide an improved method of making an electrically erasable memory, including the use of a method for forming a tunnel window having dimensions smaller than the minimum spacing allowed by usual design rules, allowing the cell size to be smaller and facilitating scaling. It is also an object to provide a non-volatile memory that uses a single low-voltage external supply for both programming and erasing, allowing the memory device to be compatible with on-board or in-circuit programming where systems have a single external power supply. An additional does not require high current for both programming and erasing.

SUMMARY OF THE INVENTION

In accordance with one embodiment of the invention, an electrically-erasable PROM or an EEPROM is constructed using an enhancement transistor merged with a floating-gate transistor. The floating-gate transistor has a small self-aligned tunnel window positioned above the source away from the channel region. The EEPROM device has a contact-free cell layout, enhancing the ease of manufacture and reducing cell size. The device has bitlines (source/drain regions) that are buried beneath relatively thick silicon oxide, allowing a favorable ratio of control gate to floating gate capacitance. Programming and erasing are accomplished using the tunnel window area on the opposite side of the bitline from the channel and drain. The tunnel window has a thinner dielectric than the remainder of the floating gate, allowing Fowler-Nordheim tunneling. By using dedicated drain and ground lines, rather than a virtual-ground circuit layout, and by using thick oxide for isolation between the bitlines of adjacent cells, the floating gate can extend onto adjacent bitlines and isolation areas, resulting in a favorable coupling ratio.

BRIEF DESCRIPTION OF THE DRAWINGS

The novel features believed characteristic of the invention are set forth in the appended claims. The invention itself, however, as well as other objects and advantages thereof, will be best understood by reference to the following description of particular embodiments thereof, when read in conjunction with the accompanying drawings, in which:

FIGS. 2a-2e views in section of the semiconductor device of FIG. 1, taken along the lines a—a, b—b, c—c, d—d, and e—e of FIG. 1;

FIG. 3 is a electrical schematic diagram of the cells of FIGS. 1 and 2a-2e; and

DETAILED DESCRIPTION OF SPECIFIC EMBODIMENT

Figure 1:
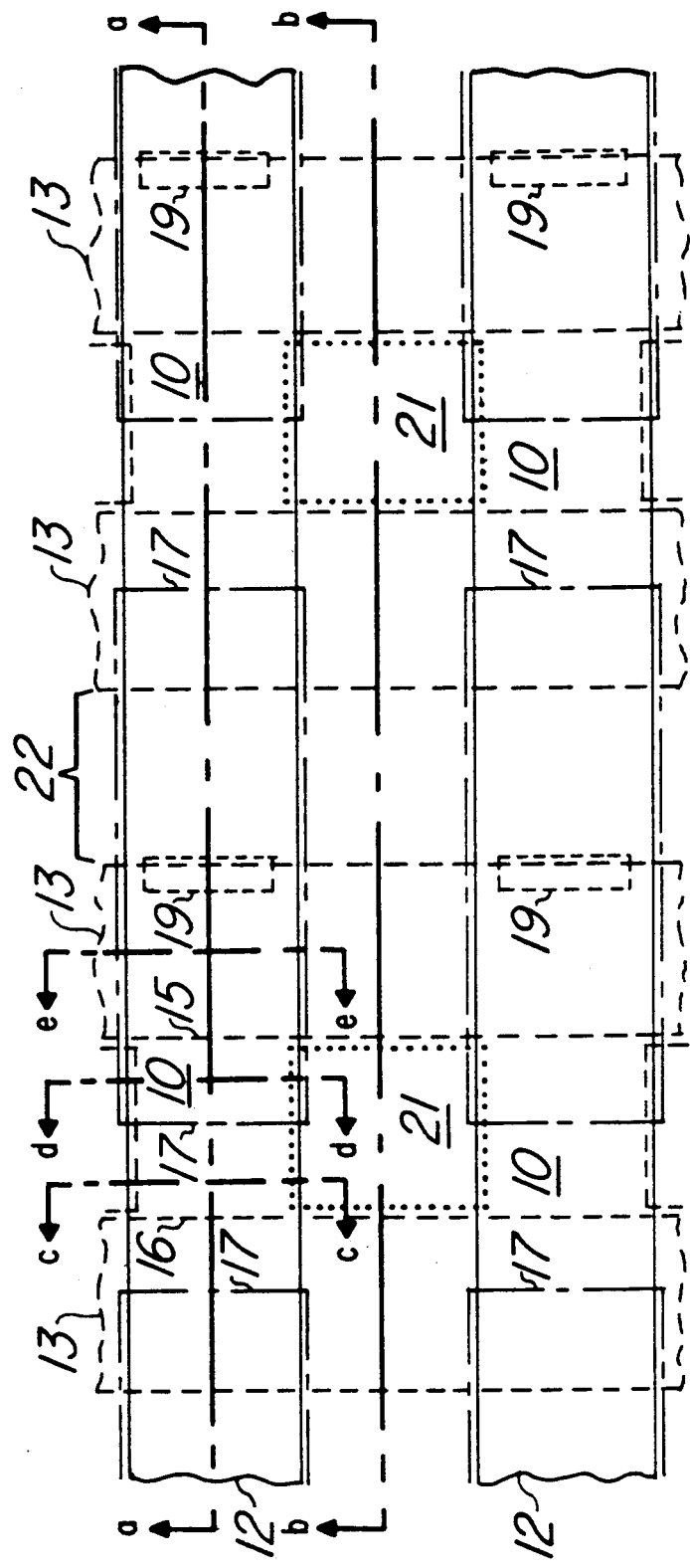
FIG. 1 is a plan view of a small part of a semiconductor chip having memory cells according to one embodiment.

Referring now to FIGS. 1, 2a-2e and 3, an array of electrically-erasable, electrically-programmable memory cells 10 is shown formed in a face of a silicon substrate 11. Only a very small part of the substrate is shown in the FIGUREs, it being understood that these cells are part of an array of a very large number of such cells. A number of wordlines/control gates 12 are formed by second-level polycrystalline silicon (polysilicon) strips extending along the face of the substrate 11, and bitlines 13 are formed beneath thick thermal silicon oxide layers 14 in the face. These buried bitlines 13 create the source region 15 and the drain region 16 for each of the cells 10. A floating gate 17 for each cell is formed by a first-level polysilicon layer extending across about half of a cell and across one bitline and extending over onto another adjacent bitline 13. Two "horizontal", or X-direction, edges of the floating gate 17 for a cell are aligned with the edges of a wordline 12.

According to the invention, a tunnel area 19 for programming and erasure is formed adjacent the source 15 of each cell, on the opposite side of the source from the drain 16 and the channel, compared to the cells shown in the above-identified co-pending U.S. Pat. applications Nos. 07/494,060 and 07/494,051, in which the tunnel window is near the source in the channel region between the source 15 and drain 16. The silicon oxide at this tunnel window 19 is thinner, about 100A, compared to the dielectric coating 20 of about 350A at the channel or compared to about 500A for the series enhancement transistor. Programming and erasing can be performed at relatively low externally-applied voltages using this structure. The coupling between layer 12 and layer 17, compared to coupling between floating gate 17 and source 15 or substrate 11, is more favorable because the floating gate extends out across the bitlines 13 and an isolating area 22. Therefore, a larger fraction of the programming/erasing voltages applied between control gate 12 and source 15 will appear between floating gate 17 and source 15. The cell 10 is referred to as "contact-free" in that no source/drain contact is needed in the vicinity of cell itself.

An area 21 is used to isolate cells from one another in the Y-direction. This area 21 may be a thick field oxide area similar to the area 21 of the above-identified co-pending U.S. Pat. application No. 07/494,060, or area 21 may be implanted with P-type impurity as disclosed in the above-identified copending U.S. Pat. application No. 07/494,051. Strips 22 of LOCOS thick field oxide separate bitlines 13 between cells in the X- direction. Note that the array of cells is not of the "virtual-ground-circuit" type; that is, there are two bitlines 13 or column lines (one for source, one for drain) for each column (Y-direction) of cells, one bitline being a dedicated ground, and one being the data input/output and sense line.

The EEPROM cells of FIGS. 1, 2a-2e and 3 are programmed with a voltage Vpp applied to the selected wordline 12 of about +16 to +18 v with respect to the source 15 of the selected cell 10. The source 15 of the selected cell 10 is at ground or other reference voltage. For example, in FIG. 3, if the cell 10a is selected to be programmed, then the selected wordline 12 labelled WL1 is brought to +Vpp and the selected source labelled S0 is grounded. The voltage +Vpp can be internally generated with charge pumps on the chip, with the externally-applied supply voltage having a relatively small positive potential, perhaps +5 v. The selected drain 16 (labelled D0 in this example) is allowed to float under these programming conditions so there is little or no current through the source-drain path. The Fowler-Nordheim tunneling across the tunnel oxide 19 (with thickness of about 100A) charges the floating gate 17 of the selected cell 10a, resulting in a shift in threshold voltage Vt of perhaps 3-6 volts after a programming pulse approximately 10 milliseconds in length.

A selected cell is erased by applying a voltage Vee (internally-generated) of perhaps −10 v on the selected wordline/control gate 12 and a voltage of about +5 v on the source 15 or bitline 13. The drain 16 (the other bitline 13) is allowed to float. During erasure tunneling, electrons flow from the floating gate 17 to the source 15 because the control gate 12 is negative with respect to the source 15.

Alternatively, the selected cell may be erased by applying an internally generated voltage of approximately 10-15 volts positive to the selected source 15, allowing the selected drain 16 to float, and connecting the selected control gate 12 to reference potential or 0 volts. Use of this method for erasure avoids the need for the negative voltage supply used in the procedure described above.

When a "flash erase" is performed (all cells 10 are erased at the same time), all of the drains 16 in the array are allowed to float, all of the sources 15 are at potential Vdd, and all of the wordlines/control gates 12 are at potential −Vee.

To prevent a write-disturb condition during the programming example (cell 10a being programmed), all of the sources 15 of non-selected cells, such as cell 10b, on the same wordline WL1 of FIG. 3 are held at a voltage Vbl, which is in the approximate range of 5-7 volts positive. The drains 16 of non-selected cells such as 10b are allowed to float, preventing source-drain currents from flowing. The voltage Vbl applied to the sources 15 prevents the electric fields across the tunnel oxides 19 of the cells, including example cell 10b, from becoming large enough to charge the floating gates 17.

Another condition to be avoided is the "bitline stress", or deprogramming, associated with a high electric field across the tunnel oxide of a programmed cell when the source of the cell is at a potential near Vbl. To prevent this bitline stress condition, the non-selected wordlines/control gates WL0 and WL2 of FIG. 3 are held at a voltage in the approximate range of 5-10 volts positive, thereby reducing the electric field across the tunnel oxide 19 of each non-selected programmed cell. A programmed cell such as 10c has a potential of about −2 to −4 volts on its floating gate, so when the voltage Vbl on the source S1 of a cell 10c is in the range of 5-7 volts positive, the field across the tunnel oxide could tend to deprogram the cell, but with voltage in the range of 5-10 volts positive on the wordline WL2, the electric field is reduced. The voltage on the wordline/control gate is not so great, however, as to cause a change in threshold voltage Vt in a cell having no charge on its floating gate.

The cells described above can be read at low voltage. For example, a row of cells can be read by placing +3 v on the selected wordline/control gate, zero volts on all of the other wordlines/control gates, zero volts on all of the sources, and +1.5 v on all of the drains. In this condition, the source-drain path of a cell will be conductive with the cell in an erased state (a cell with zero charge on its floating gate), i.e., storing a logic one. A programmed cell (programmed to the high-voltage-threshold state, with negative charge on the floating gate) will not conduct, i.e., storing a logic zero.

Figure 4A:
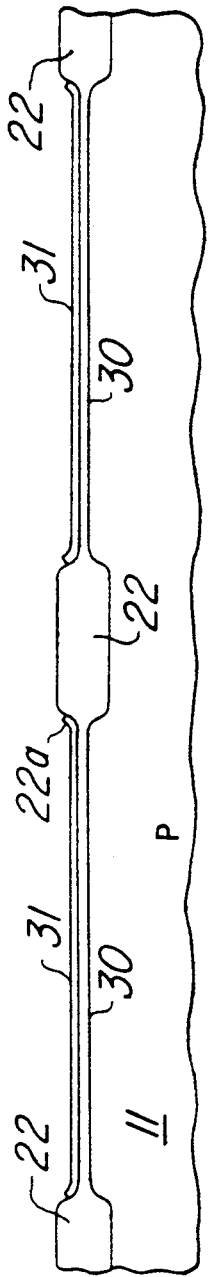
FIGS. 4a-4d are elevation views in section, corresponding to FIG. 2a, of the device of FIGS. 1 and 2a-2e, at successive stages in the manufacture thereof.

A method of making the device of FIGS. 1 and 2a-2e will be described in reference to FIGS. 4a-4d. The starting material is a slice of P-type silicon of which the substrate 11 is only a very small portion. The slice is perhaps 6 inches in diameter, while the portion shown in FIG. 1 is only a few microns wide. A number of process steps would be performed to create transistors peripheral to the array, and these will not be discussed here. For example, the memory device may be of the complementary field-effect type having N-wells and P-wells formed in the substrate as part of a prior process to create peripheral transistors. The first step related to the cell array of the invention is applying oxide and silicon nitride coatings 30 and 31 as seen in FIG. 4a, and patterning these coatings using photoresist to leave nitride over what will be the channel regions, tunnel areas, sources, drains, and bitlines 13, while exposing the areas where the thick field oxide 22 (and 21, if oxide isolation is used) is to be formed. A boron implant at about $8 \times 10^{12}$ cm$^{-2}$ dosage is performed to create a P+channel stop beneath the field oxide 22 (and 21, if applicable). Then the field oxide is grown to a thickness of about 9000A by exposing to steam at about 900° C. for several hours. The thermal oxide grows beneath the edges of the nitride 31, creating a "bird's beak" 22a instead of a sharp transition.

Figure 4B:
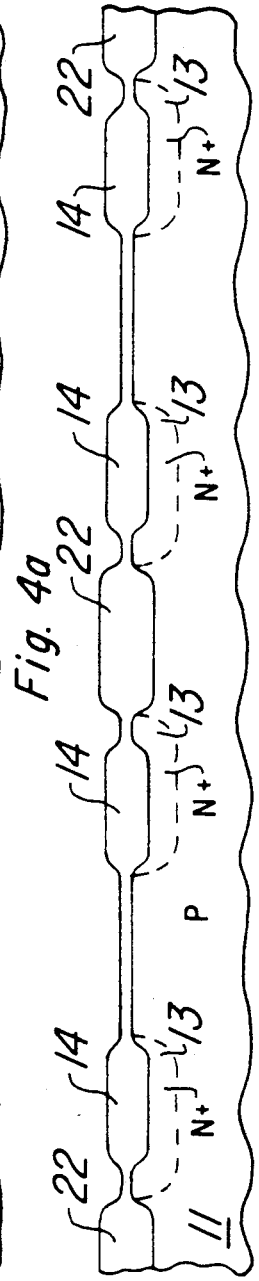

Turning now to FIG. 4b, the nitride 31 is removed and, in the area where the bitlines 13 are to be formed, an arsenic implant is performed at a dosage of about $6 \times 10^{15}$ cm$^{-2}$ at 135 KeV, using photoresist as an implant mask, to create the source/drain regions and bitlines. Next another thermal oxide 14 is grown on the face to a thickness of about 2500 to 3500A over the N+buried bitlines, during which time a thermal oxide of about 300A will grow over the channel areas (due to the differential oxidation occurring when heavily-doped and lightly-doped silicon areas are exposed to oxidation at the same time), to create the oxide layers 14 above the source/drain regions and bitlines 13. This oxidation is in steam at about 800° to 900° C. At the transition areas 18 where the bird's beak 22a has been formed, the edge of the originally-formed thermal oxide has masked the arsenic implant so the concentration is lower and so the oxide growth in that area is less than that of the oxide 14 or the oxide 22.

Figure 4C:
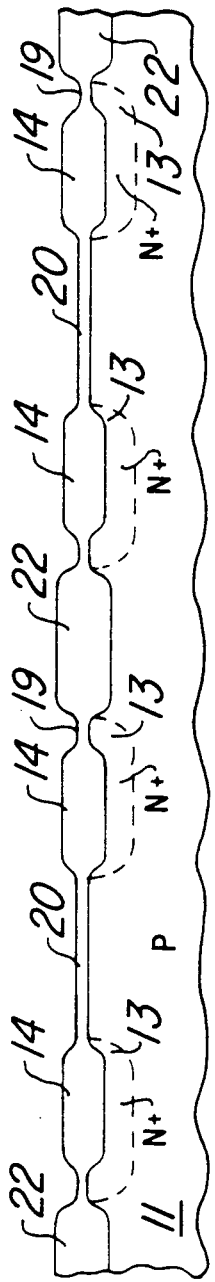
Figure 4D:
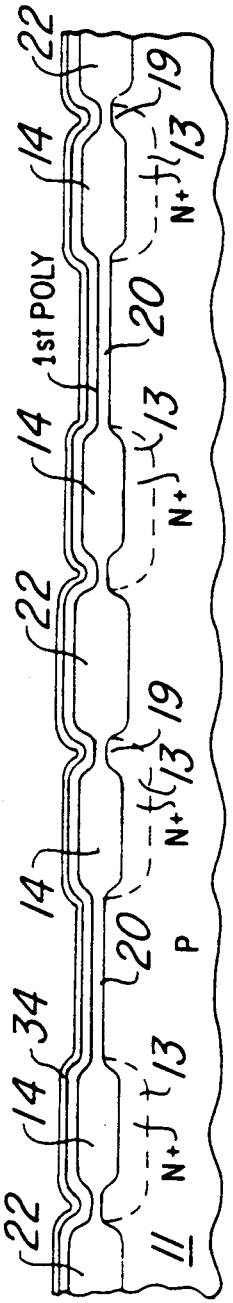

Referring to FIG. 4c, a window 19 is opened in the oxide in the transition area 18. This is done using photoresist as a mask, and etching through the oxide of transition area 18 to the bare silicon, then regrowing a thinner oxide for the tunnel window 19. During oxidation of tunnel window 19, gate oxide 20 will grow to approximately 350A. Optionally, a light phosphorus implant in the tunnel window 19 can be used for enhanced field plate breakdown voltage.

Because of the curved surface of transition area 18, the width of tunnel window 19 may be controlled by varying the length of time for the etch through transition area 18.

A first polysilicon layer, doped N+, is now applied to the face of the silicon slice, and a coating 34 of oxide, or oxide-nitride-oxide, is applied to separate the two polysilicon levels. A first-level polysilicon is defined using photoresist to leave elongated strips in the Y-direction, parts of which will become the floating gates 17. An oxidation, performed after the first-level polysilicon is defined, covers the edges of first-level polysilicon, and also creates the gate oxides 35 for the series enhancement transistors 36. A second polysilicon layer is deposited, doped N+, and patterned using photoresist to create the wordlines/control gates 12. At the same time as the wordlines/control gates 12 are defined, the edges of the first-level polysilicon are etched, so that the elongated X-direction edges of the floating gates are self-aligned with the edges of the control gates. It should be noted that the Figures are not drawn to scale and that, in particular, the thicknesses of the first and second polysilicon layers are generally much greater than the thicknesses of oxide layers 19, 20 and 35.

If junction isolation is to be used for the isolating regions 21, a self-aligned ion implant step is performed, using the stacked polysilicon-1 and polysilicon-2 layers of wordlines/control gates 12 and floating gates 17 as a mask to create the isolating regions 21. For this purpose, boron is implanted at a dosage of about $10^{12}$ cm$^{-2}$, at about 70 KeV. After annealing and oxidation, this implant produces P+regions under regions 21 very much like channel stop implants beneath field oxide.

One advantage of the placement of the tunnel window on the opposite side of the source from the drain as described above is that the alignment of the masks in manufacture is considerably less critical, compared to the methods disclosed in the above-identified applications. In addition, an important advantage is that the field-plate breakdown voltage of the junction between the buried N+ region and the substrate is enhanced due to the fact that on both sides of the N+ to P junction the overlying oxide has greater thickness than the 100A tunnel oxide. Additionally, the overall cell size can be reduced because the alignments for the tunnel need not be considered. The tunnel itself can have a width smaller than the minimum spacing allowed by usual design rules. Also the cell is capable of "scaling" in a bar-shrink or re-design.

While the invention has been described with reference to an illustrative embodiment, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

What is claimed is:

1. An electrically erasable and programmable memory cell formed at a face of a semiconductor layer of a first conductivity type, comprising:

a thick insulator region selectably grown at said face from said semiconductor layer, a lateral margin of said insulator region being sloped with respect to said face, said thick insulator region having a thickness;

first and second source/drain regions implanted into said face with a dopant to be of a second conductivity type opposite said first conductivity type;

an oxide region grown on said first source/drain region, a lateral margin of said oxide region being sloped with respect to said face, said oxide region having a thickness, a junction of said sloped lateral margin of said oxide region and said sloped lateral margin of said thick insulator region creating a thin insulator transition area, at least a portion of said thin transition area adjoining said first source/drain region;

insulator material within said thin insulator transition area etched back to expose said semiconductor layer, a thin tunnel insulator grown on said exposed semiconductor layer within said thin transition area, a width of said thin tunnel insulator between said thick insulator region and said oxide region being independent of said thicknesses of said thick insulator region and said oxide region;

a channel area of said semiconductor layer extending between said first and said second source/drain regions, a floating gate formed over said tunnel insulator and insulatively disposed over at least a portion of said channel area; and a control gate insulatively disposed adjacent said floating gate.

2. A memory cell according to claim 1, and further comprising a gate insulator layer formed over a portion of said channel area adjacent said oxide region and laterally opposed to said thin insulator transition area, a thickness of said gate insulator layer being much less than the largest thickness of said dopant-enhanced oxide region.

3. A memory cell according to claim 1, wherein said control gate is part of an elongated word line extending along said face, and wherein said source/drain regions are parts of elongated bit lines extending along said face at an angle to said word line.

4. A memory cell according to claim 1, wherein edges of said control gate are aligned with edges of said floating gate.

5. A memory cell according to claim 1, and further comprising conductor layers insulatively overlying said control gate, no contact being formed between said source/drain regions and said overlying conductor layers in the vicinity of said cell.

6. A memory cell according to claim 1, wherein the width of said tunnel insulator between insulator region and said oxide region is adjustable by adjusting the period of etching back to the semiconductor layer.

7. A memory cell according to claim 1, wherein said tunnel area insulator is self-aligned between said oxide region and said thick insulator region.

8. The memory cell of claim 1, wherein said thick insulator region comprises an oxide.

9. The memory cell of claim 1, and further comprising a second thick insulator region grown at said face from said semiconductor layer, said channel area and said first and second source/drain regions substantially spacing said thick insulator region from said second thick insulator region.

10. The memory cell of claim 1, and further comprising an oxide region grown from said face over said second source/drain region.

11. The memory cell of claim 1, wherein a subregion of said first source/drain region adjoining said tunnel insulator is doped with a second dopant to enhance field plate breakdown voltage.

12. The memory cell of claim 1, wherein a lateral edge of said first source/drain region is disposed under said insulator region, a concentration of said dopant within said first source/drain region decreasing as a function of the thickness of said sloped margin of said thick insulator region over said dopant, said oxide region differentially grown on said first source drain/region as a function of the concentration of said dopant.

13. An array of electrically-erasable and programmable memory cells formed at a face of a semiconductor layer of a first conductivity type, said cells formed in rows and columns, said array comprising:

a plurality of elongate thick insulator regions selectively grown at said face from said semiconductor layer to be substantially parallel and spaced from each other, a column of cells formed between adjacent ones of said thick insulator regions, lateral margins of said thick insulator regions being sloped with respect to said face;

for each column, first and second source/drain regions implanted into said face with a dopant to be of a second conductivity type opposite said first conductivity type, each said first source/drain region disposed laterally adjacent a respective thick insulator region;

an elongated oxide region grown on said first source/drain region, a lateral margin of said oxide region being sloped with respect to said face, a junction of said sloped lateral margin of said oxide region and said sloped lateral margin of said thick insulator region creating a thin insulator transition area, at least a portion of said thin transition area adjoining said first source/drain region;

for each cell, a tunnel window area comprising a respective portion of said thin transition area, insulator material within said tunnel window area etched back to expose said semiconductor layer, a thin tunnel insulator grown on said exposed semiconductor layer within said tunnel window area, a width of said thin tunnel insulator between said thick insulator region and said oxide region being independent of said thicknesses of said thick insulator region and said oxide region;

for each cell, a channel region of said first conductivity type extending between respective ones of said first and said second source/drain regions;

for each cell, a floating gate formed over a respective tunnel insulator and insulatively disposed over at least a portion of a respective channel region; and for each row of cells, an elongate control gate disposed to be capacitively coupled to said floating gates in said row.

14. The array of claim 13, and further comprising a gate insulator layer formed over a portion of said channel region adjacent said oxide region and laterally opposed to said tunnel window area, a thickness of said gate insulator layer being much less than the largest thickness of said oxide region.

15. The array of claim 13, wherein edges of said control gates are aligned with edges of respective ones of said floating gates.

16. The array of claim 13, and further comprising conductor layers insulatively overlying said control gates, no contact being formed between said source/- drain regions and said overlying conductor layers in the vicinity of said cells.

17. The array of claim 13, wherein the width of said tunnel insulator between said thick insulator region and said oxide region is adjustable by adjusting the period of etching back to the semiconductor layer.

18. The array of claim 13, wherein said tunnel window area is self-aligned between said oxide region and said thick insulator region.

19. The array of claim 13, wherein said thick insulator regions comprise an oxide.

20. The array of claim 13, and further comprising, for each column, an oxide region grown from said face over said second source/drain region.

21. The array of claim 13, wherein a subregion of said first source/drain region adjoining said tunnel insulator is doped with a second dopant to enhance field plate breakdown voltage.

22. The array of claim 13, wherein a lateral edge of each said first source/drain region is disposed under an adjacent, respective thick insulator region, a concentration of said dopant within said first source/drain region decreasing as a function of thickness of said sloped margin of said thick insulator region over said dopant, said elongated oxide region differentially grown on said first source/drain region as a function of the concentration of said dopant, the thickness of said lateral margin of said oxide region varying with the concentration of said dopant thereunder.

* * * * *